United States Patent
Zhou et al.

(10) Patent No.: US 9,899,221 B2
(45) Date of Patent: Feb. 20, 2018

(54) METHOD FOR PREPARING ELECTRODE

(71) Applicant: Shenzhen China Star Optoelectronics Technology Co., Ltd., Shenzhen, Guangdong (CN)

(72) Inventors: Zhichao Zhou, Guangdong (CN); Hui Xia, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 29 days.

(21) Appl. No.: 15/113,432

(22) PCT Filed: Jun. 29, 2016

(86) PCT No.: PCT/CN2016/087677
§ 371 (c)(1),
(2) Date: Jul. 21, 2016

(65) Prior Publication Data
US 2017/0372901 A1 Dec. 28, 2017

(51) Int. Cl.
*H01L 21/44* (2006.01)
*H01L 21/04* (2006.01)
*H01L 21/82* (2006.01)
*H01L 21/28* (2006.01)

(52) U.S. Cl.
CPC .... *H01L 21/0425* (2013.01); *H01L 21/28123* (2013.01); *H01L 21/82* (2013.01)

(58) Field of Classification Search
CPC .......................... H01L 21/28123; H01L 21/82; H01L 21/0425
See application file for complete search history.

(56) References Cited

U.S. PATENT DOCUMENTS

2008/0254606 A1* 10/2008 Baek ..................... B82Y 10/00
438/585
2009/0047759 A1* 2/2009 Yamazaki ............... H01L 29/04
438/158

* cited by examiner

*Primary Examiner* — Elias M Ullah
(74) *Attorney, Agent, or Firm* — Andrew C. Cheng

(57) ABSTRACT

The present disclosure discloses a method for preparing electrode including: providing a substrate; forming a buffer layer on the substrate; forming a patterned photoresist on the surface of the buffer layer away from the substrate, the photoresist has a bottom surface and a top surface disposed opposite and a side connected between the bottom surface and the top surface, the bottom surface is bonded to the buffer layer; by dry etching, the portions of the photoresist not covered by the buffer layer is removed to form a receiving area; depositing a conductive film, the conductive film layer includes a waste material forming on the top surface and an electrode filling in the receiving area; and stripping the waste material and the photoresist. The yields of the method for preparing electrode of the present disclosure is high.

13 Claims, 4 Drawing Sheets

METHOD FOR PREPARING ELECTRODE

CROSS REFERENCE

The present disclosure claims the priority of No. 201610436577.6, entitled "method for preparing electrode", filed on Jun. 17, 2016, the disclosure of which is incorporated herein by reference in its entirety.

FIELD OF THE DISCLOSURE

The present disclosure relates to an array substrate preparing technology field, and more particularly to a method for preparing an electrode.

BACKGROUND OF THE DISCLOSURE

In the liquid crystal display panel industry, the current electrode in the array substrate of the LCD panel is generally used the wet etching process to patterned. However, the wet etching process is difficult to accurately adjust the Taper Angle of the electrode and the CD Loss, which led to low yields of the electrode of the array substrate.

SUMMARY OF THE DISCLOSURE

The technical problem to be solved by the present disclosure is to provide a method for preparing a high yield electrode can be used to prepare the electrode of the array substrate.

To achieve the above object, the embodiment of the present disclosure is used the following technical solutions:
providing a method for preparing an electrode, including:
providing a substrate;
forming a buffer layer on the substrate;
forming a patterned photoresist on the surface of the buffer layer away from the substrate, the photoresist has a bottom surface and a top surface disposed opposite and a side connected between the bottom surface and the top surface, the bottom surface is bonded to the buffer layer;
by dry etching, the portions of the photoresist not covered by the buffer layer is removed to form a receiving area;
depositing a conductive film, the conductive film layer includes a waste material forming on the top surface and an electrode filling in the receiving area;
and
stripping the waste material and the photoresist.

Wherein, the buffer layer has a first thickness T1, an angle α is formed between the side and the bottom surface of the photoresist, the side perpendicular to the direction of the bottom surface has a second thickness T2, satisfy: 75°≤α≤90° and T2≥2T1, so that mutual cut off between the waste material and the electrode.

Wherein, the "by dry etching, the portions of the photoresist not covered by the buffer layer is removed to form a receiving area" includes:
by the etching gas pounding the buffer layer, the portion of the photoresist not covered by the buffer layer is removed to form a receiving area;
at the same time, pounding the top surface by the etching gas to uneven the top surface;
the etching gas includes carbon tetrafluoride gas, oxygen and argon, or the etching gas includes sulfur hexafluoride, oxygen and argon.

Wherein, the range of the ratio of the volume flow of the carbon tetrafluoride gas, the oxygen gas and the argon gas in the etching gas is 4:1:1 to 4:8:1.

Wherein, the volume flow of the carbon tetrafluoride gas is 400 sccm, the volume flow of the oxygen gas is 400 sccm and the volume flow of the argon gas is 100 sccm.

Wherein, the "stripping the waste material and the photoresist" includes:
by the gas-liquid two-fluid flushing the waste material to strip the waste material on the photoresist;
stripping the photoresist on the buffer layer.

Wherein, the substrate is an organic substrate, a glass substrate, an organic film or an inorganic film.

Wherein, the "forming a buffer layer on the substrate" includes:
by the chemical vapor deposition process, depositing the silica and/or silicon nitride and/or alumina on the substrate to form a buffer layer.

Wherein, the electrode includes a first layer and a second layer arranged stacked, the first layer is bounded the substrate, the first layer includes molybdenum and/or titanium and/or niobium, the second layer includes copper element.

Wherein, the electrode is gate electrode, source electrode and drain electrode, pixel electrode and gate line or data lines.

Compared to the prior art, the present disclosure has the following advantageous effects:

The method for preparing electrode of the embodiment of the present disclosure, as a result of the dry etching process forming the receiving area, the etching directional of the dry etching process is strong, and the process control is precise, it is possible to accurately control the shape of the outer contour of the receiving area, that can accurately control the shape of the electrode filled in the receiving area, e.g., the Taper Angle and the CD Loss of the electrodes, so that the yield rate of the electrode is high. Of course, with respect to the wet etching process of the prior art, the dry etching process without using the expensive etching solution (e.g., an acid copper solution), such that the production cost of the electrodes are low.

At the same time, since the electrode is filled in the receiving area, i.e. the electrode embedded in the buffer layer, so the sides of the electrode can be well protected, to reduce the oxidation risk of the electrode, further improve the yield of the electrode.

Furthermore, the Taper Angle of the electrode is vertical angle or near vertical angle is not sharp, and therefore can reduce the risk of the occurrence of the electrode tip discharge, to further improve the yield of the electrode.

BRIEF DESCRIPTION OF THE DRAWINGS

In order to more clearly illustrate the technical solutions of the present disclosure, it will simple introduce the required figures in the embodiment, obviously, in the following description the drawings are only some embodiments of the present disclosure, those of ordinary skill in speaking, without creative efforts of the premise, you can also obtain other drawings based on these drawings.

DETAILED DESCRIPTION OF PREFERRED EMBODIMENTS

Figure 1:
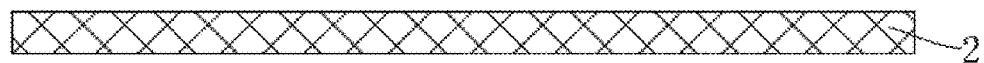
FIG. 1 to FIG. 6 is a schematic view of the structure of the embodiment of the present disclosure, the method for preparing the electrode corresponding to each step.

The present disclosure will now be combined with the implementation of the accompanying drawings, were clear examples of technical solutions of the present disclosure, fully described, it is clear that the described embodiments are merely part of the embodiments of the present disclosure, but not all embodiments Example. Based on the embodiments of the present disclosure, those of ordinary skill in not making all other embodiments without creative efforts obtained, are within the scope of the present disclosure is protected.

In addition, the following description of embodiments with reference to the attached diagram for illustrating particular embodiments may be used to embodiments of the present disclosure. Term direction of the present disclosure are mentioned, for example, "upper", "lower", "front", "rear", "left", "right", "inside", "outside", "side" and so on, only with reference to the accompanying drawings, direction, and thus, the direction of terms used in order to better and more clearly illustrate the present disclosure and understanding, rather than indicating device or element or imply referred to must have a specific orientation, with particular orientation construction and operation, and therefore cannot be construed as limiting the present disclosure.

In the description of the present disclosure, it should be noted that, unless otherwise clearly defined and limited, the term "mounted," "connected," "connection," "arranged on" to be broadly understood, for example, may be a fixed connection to be is a detachable connection, or integrally connected; can be mechanically connected, or may be electrically connected; it can be directly connected, or may be connected indirectly through intermediaries, two elements may be in communication with the interior. Those of ordinary skill in the art, it can be understood that the above terms specific meaning in the present disclosure by the specific circumstances.

Furthermore, in the description of the present disclosure, unless otherwise indicated, "plurality" means two or more. If the term "step" in the present specification appear, which means not only a separate step, while no clear distinction with other processes, this step can be realized as long as the intended function is also included in the parlance. In this specification, by "~" indicates the numerical range means that the "-" values before and after, respectively, as described, including the maximum and minimum values of the range.

Please refer to FIG. 1 to FIG. 7, the embodiment of the present disclosure provides a method for preparing an electrode to prepare a plurality of electrodes 1 on the array substrate. The method for preparing electrode includes:

Step 1: providing a substrate 2;

Step 2: forming a buffer layer 3 on the substrate 2;

Step 3: forming a patterned photoresist 4 on the surface of the buffer layer 3 away from the substrate 2, the photoresist 4 has a bottom surface 41 and a top surface 42 disposed opposite and a side 43 connected between the bottom surface 41 and the top surface 42, the bottom surface 41 is bonded to the buffer layer 3;

Step 4: by dry etching, the portions of the photoresist 4 not covered by the buffer layer 3 is removed to form a receiving area 10;

Step 5: depositing a conductive film 5, the conductive film layer 5 includes a waste material 51 forming on the top surface 42 and an electrode 1 filling in the receiving area 10; and Step 6: stripping the waste material 51 and the photoresist 4.

In the present embodiment, as a result of the dry etching process forming the receiving area 10 in step 4, the etching directional of the dry etching process is strong, and the process control is precise, it is possible to accurately control the shape of the outer contour of the receiving area 10, that can accurately control the shape of the electrode 1 filled in the receiving area 10, e.g., the Taper Angle (That is the angle β between the hypotenuse of the electrode 1 and the bottom surface) and the CD Loss (Critical Dimension Loss) of the electrodes 1, so that the yield rate of the electrode 1 is high. Of course, with respect to the wet etching process of the prior art, the dry etching process without using the expensive etching solution (e.g., an acid copper solution), such that the production cost of the electrodes 1 are low.

At the same time, since the electrode 1 is filled in the receiving area 10, i.e. the electrode 1 embedded in the buffer layer 3, so the sides of the electrode 1 can be well protected, to reduce the oxidation risk of the electrode 1, further improve the yield of the electrode 1.

Figure 7:
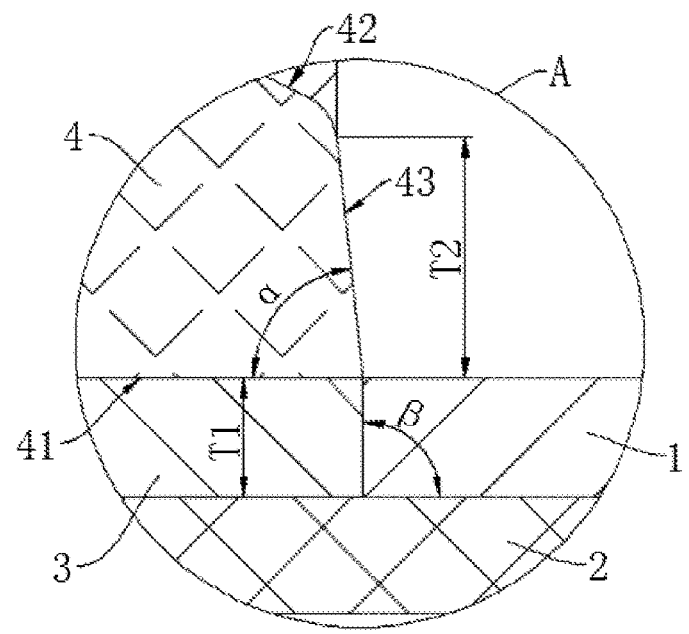
FIG. 7 is an enlarged schematic diagram of the A place in the FIG. 5.

Furthermore, as shown in FIG. 7, the angle β of the electrode 1 is vertical angle or near vertical angle is not sharp, and therefore can reduce the risk of the occurrence of the electrode 1 tip discharge, to further improve the yield of the electrode 1.

Further, as an alternative embodiment, in the step 1, the substrate 2 can an organic substrate, a glass substrate, an organic film, an inorganic film, etc., that is the electrode 1 and the buffer layer 3 may be formed on the substrate of the array substrate, may be formed on another film of the array substrate, can be flexibly designed according to the structure of the electrode 1 and the functional requirements.

Figure 2:
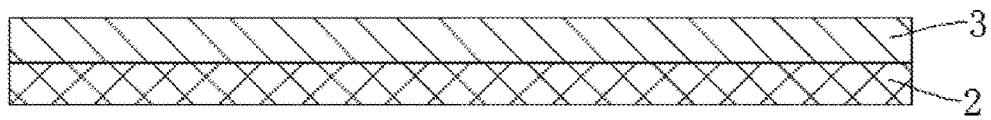
Figure 5:
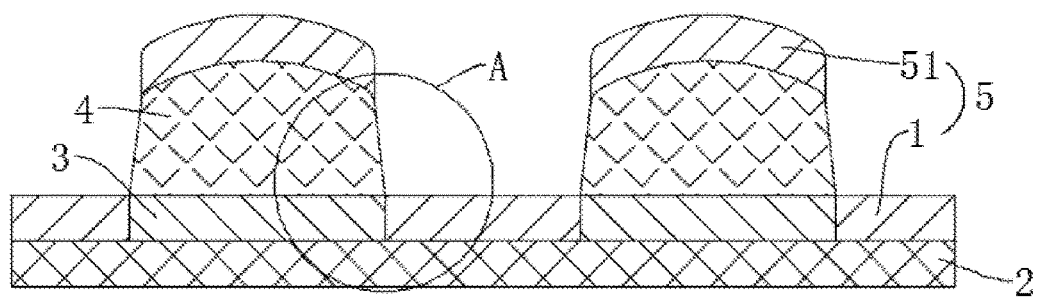

Further, please refer to FIG. 2, FIG. 5 and FIG. 7, as an alternative embodiment, in the step 2, the "forming a buffer layer 3 on the substrate 2" includes:

by the chemical vapor deposition (VCD) process, depositing the silica (SiOx) and/or silicon nitride (SiNx) and/or alumina (Al2O3) on the substrate 2 to form a buffer layer 3.

As shown in FIG. 5 and FIG. 7, the buffer layer 3 has a first thickness T1. Further, the first thickness T1 satisfied: 1000 Å≤T1≤6000 Å.

Figure 3:
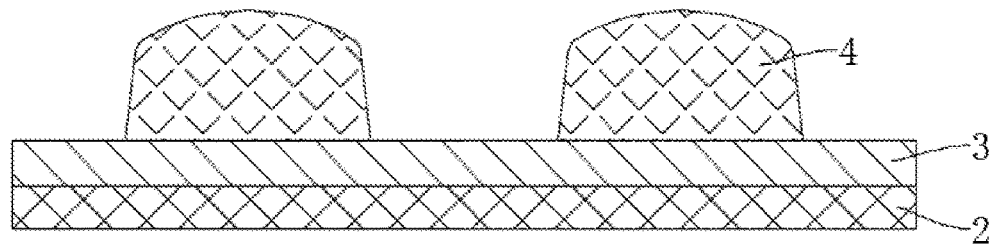

Further, please refer to FIG. 3, as an alternative embodiment, in the step 3, the patterned photoresist 4 can be formed on the surface of the buffer layer 3 away from the substrate 2 by the process of coating, exposure, development, post-baking, etc.

Further, please refer to FIG. 3, FIG. 5 and FIG. 7, as an alternative embodiment, in the step 3, the angle α is formed between the side 43 and the bottom surface 41 of the photoresist 4, the side 43 perpendicular to the direction of the bottom surface 41 has a second thickness T2, satisfy: 75°≤α≤90° and T2≥2T1, so that mutual cut off between the waste material 51 and the electrode 1.

In other words, since the photoresist 4 having a high and steep side 43 (satisfy 75°≤α≤90° and T2≥2T1), therefore, in the depositing process of the conducting film 5 (Step 5), while depositing the electrode 1 and the waste material 51 will naturally cut off mutually.

Will be appreciated, since mutual cut off between the waste material 51 and the electrode 1, since the surface of the electrode 1 in the stripping process of the waste material 51 will not be damaged, the surface of the electrode 1 has a very high flatness, resulting in the subsequent process of the array substrate, can greatly reduce the risk of the climbing short-term of the gate insulator (GI) and the passivation (PV).

Figure 8:
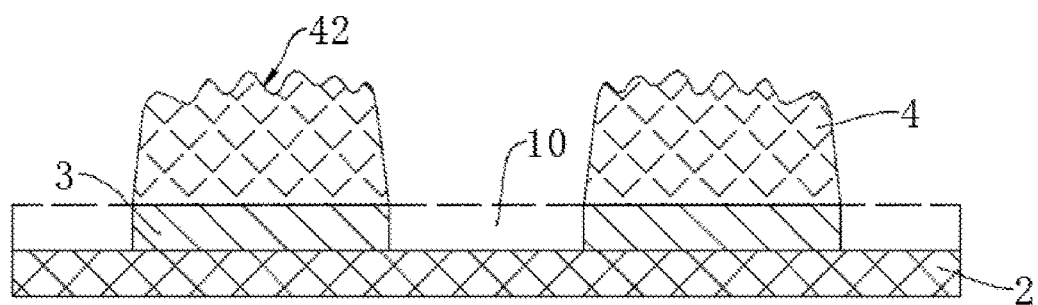
FIG. 8 is another schematic view of the structure corresponding to the step 4 in a method for preparing an electrode of the embodiment of the present disclosure provided.
Figure 9:
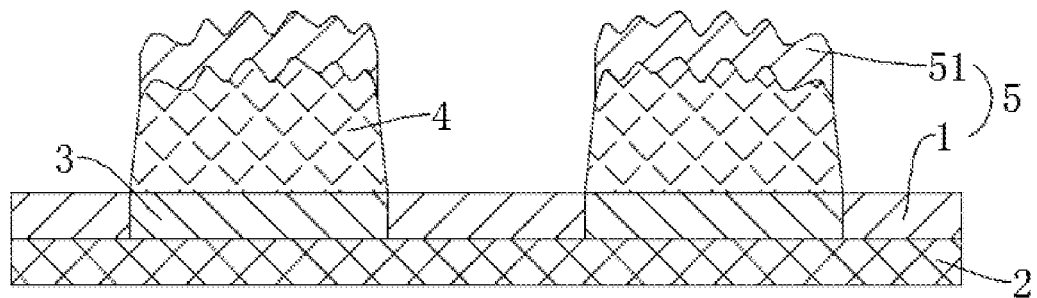
FIG. 9 is another schematic view of the structure corresponding to the step 5 in a method for preparing an electrode of the embodiment of the present disclosure provided.

Further, please refer to FIG. 8 and FIG. 9, as an alternative embodiment, in the step 4, the "by dry etching, the portions of the photoresist 4 not covered by the buffer layer 3 is removed to form a receiving area 10" includes:

by the etching gas pounding the buffer layer 3, the portion of the photoresist 4 not covered by the buffer layer 3 is removed to form a receiving area 10;

at the same time, pounding the top surface 42 by the etching gas (that is the etching gas pounding the buffer layer 3 and the top surface 42 at the same time) to uneven the top surface 42;

the etching gas includes carbon tetrafluoride gas, oxygen and argon, or the etching gas includes sulfur hexafluoride, oxygen and argon.

In the present embodiment, the etching gas by controlling the various gas flow rate and the flow rate ratio, after the etching gas pounding the top surface 42, the oxygen and the argon (or other inert gas may be) bombarding the top surface 42, so that the top surface 42 is uneven and very rough dry, thereby helping to reduce the difficulty of peeling off the waste material 51 in the subsequent process.

Further, in order to ensure that the bombardment effect of the oxygen and the argon to the top surface 42, may be appropriate to increase the flow rate of the oxygen and argon, the range of the ratio of the volume flow of the carbon tetrafluoride gas, the oxygen gas and the argon gas in the etching gas may be 4:1:1 to 4:8:1.

For example, the volume flow of the carbon tetrafluoride gas is 400 sccm (normal state milliliter per minute), the volume flow of the oxygen gas is 400 sccm (normal state milliliter per minute) and the volume flow of the argon gas is 100 sccm (normal state milliliter per minute).

Figure 6:
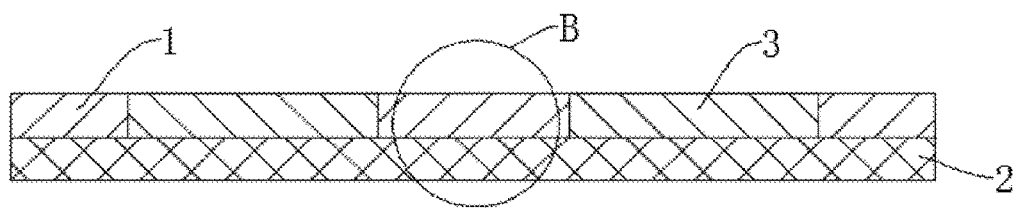

Further, please refer to FIG. 8, FIG. 9 and FIG. 6, as an alternative embodiment, in the step 6, the "stripping the waste material 51 and the photoresist 4" includes:

by the gas-liquid two-fluid flushing the waste material 51 to strip the waste material 51 on the photoresist 4;

stripping the photoresist 4 on the buffer layer 3.

In the present embodiment, since the top surface 42 is uneven and very rough dry, it can easily be flushing by the gas-liquid two-fluid, and the waste material 51 is stripped on the photoresist 4, thereby improving the stripping process of the waste material 51 to avoid a large number of the conductive film (e.g., a copper film) remaining in the stripping tank and affect the subsequent stripping process.

Figure 4:
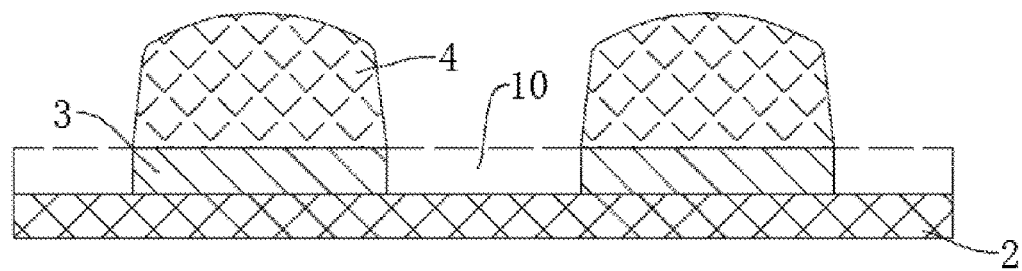

It should be understood, as another alternative embodiment, please refer to FIG. 4 to FIG. 6, when the top surface 42 is more smooth, it can also be used by the stripping process to strip the waste material 51.

Figure 10:
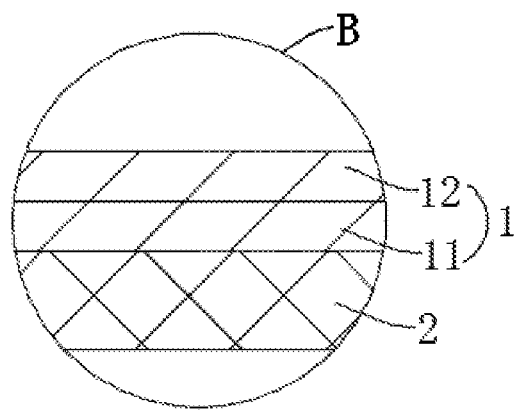
FIG. 10 is an enlarged schematic diagram of the B place in the FIG. 6.

Further, please refer to FIG. 5, FIG. 6 and FIG. 10, as an alternative embodiment, in the step 5, may depositing the conductive film 5 by the physical vapor deposition (PVD) process. Including but not limited to, vacuum evaporation, sputtering and ion plating and the like.

Further, the electrode 1 includes a first layer 11 and a second layer 12 arranged stacked, the first layer 11 is bounded the substrate 2. The first layer 11 includes molybdenum and/or titanium and/or niobium, that is, the first layer 11 may be molybdenum, titanium, niobium, molybdenum titanium alloy or molybdenum niobium alloy. The second layer 12 includes copper, i.e. the second layer 12 is a copper layer. The first layer 11 may be used to improve the adhesion of the second layer 12.

Further, as an alternative embodiment, the electrode 1 may be the gate electrode, source electrode and drain electrode, the pixel electrode and the gate line or data lines of the array substrate. That is, the method for preparing electrode can be used for the gate electrode, source electrode and drain electrode, the pixel electrode and the gate line or data lines of the array substrate. It will be understood, the electrode 1 is also used as the other conductive layer of the array substrate.

The embodiment of the present disclosure further provides an array substrate including an electrode, the electrode is prepared by the method for preparing electrode of any of the preceding embodiments.

The embodiment of the present disclosure further provides a liquid crystal display panel including the array substrate according to the embodiment described above. The LCD panel can be used for a variety of display devices, the display devices include, but are not limited to cell phones, notebooks, tablet PCs, POS, automotive computers, cameras and the like.

Although the present embodiment of the disclosure are described in detail in this article applies specifically a case of principle and embodiments of the present disclosure have been described, description of the above embodiments are designed to facilitate understanding of the method and its core idea of the disclosure; Meanwhile, those of ordinary skill in the art, according to the idea of the present disclosure, in the specific embodiments and applications are subject to change place, summary, contents of this document should not be construed as limiting the present disclosure.

What is claimed is:

1. A method for preparing an electrode, wherein, comprises:

providing a substrate;

forming a buffer layer on the substrate;

forming a patterned photoresist on the surface of the buffer layer away from the substrate, the photoresist has a bottom surface and a top surface disposed opposite and a side connected between the bottom surface and the top surface, the bottom surface is bonded to the buffer layer;

by dry etching, the portions of the photoresist not covered by the buffer layer is removed to form a receiving area;

depositing a conductive film, the conductive film layer comprises a waste material forming on the top surface and an electrode filling in the receiving area;

stripping the waste material and the photoresist; and wherein, the buffer layer has a first thickness T1, an angle $\alpha$ is formed between the side and the bottom surface of the photoresist, the side perpendicular to the direction of the bottom surface has a second thickness T2, satisfy: $75° \leq \alpha \leq 90°$ and $T2 \geq 2T1$, so that mutual cut off between the waste material and the electrode.

2. The method for preparing electrode according to claim 1, wherein the "by dry etching, the portions of the photoresist not covered by the buffer layer is removed to form a receiving area" comprises:

by the etching gas pounding the buffer layer, the portion of the photoresist not covered by the buffer layer is removed to form a receiving area;

at the same time, pounding the top surface by the etching gas to uneven the top surface;

the etching gas comprises carbon tetrafluoride gas, oxygen and argon, or the etching gas comprises sulfur hexafluoride, oxygen and argon.

3. The method for preparing electrode according to claim 2, wherein the range of the ratio of the volume flow of the carbon tetrafluoride gas, the oxygen gas and the argon gas in the etching gas is 4:1:1 to 4:8:1.

4. The method for preparing electrode according to claim 3, wherein the volume flow of the carbon tetrafluoride gas is 400 sccm, the volume flow of the oxygen gas is 400 sccm and the volume flow of the argon gas is 100 sccm.

5. The method for preparing electrode according to claim 2, wherein the "stripping the waste material and the photoresist" comprises:
by the gas-liquid two-fluid flushing the waste material to strip the waste material on the photoresist;
stripping the photoresist on the buffer layer.

6. The method for preparing electrode according to claim 1, wherein the "by dry etching, the portions of the photoresist not covered by the buffer layer is removed to form a receiving area" comprises:
by the etching gas pounding the buffer layer, the portion of the photoresist not covered by the buffer layer is removed to form a receiving area;
at the same time, pounding the top surface by the etching gas to uneven the top surface;
the etching gas comprises carbon tetrafluoride gas, oxygen and argon, or the etching gas comprises sulfur hexafluoride, oxygen and argon.

7. The method for preparing electrode according to claim 6, wherein the range of the ratio of the volume flow of the carbon tetrafluoride gas, the oxygen gas and the argon gas in the etching gas is 4:1:1 to 4:8:1.

8. The method for preparing electrode according to claim 7, wherein the volume flow of the carbon tetrafluoride gas is 400 sccm, the volume flow of the oxygen gas is 400 sccm and the volume flow of the argon gas is 100 sccm.

9. The method for preparing electrode according to claim 6, wherein the "stripping the waste material and the photoresist" comprises:
by the gas-liquid two-fluid flushing the waste material to strip the waste material on the photoresist;
stripping the photoresist on the buffer layer.

10. The method for preparing electrode according to claim 1, wherein the substrate is an organic substrate, a glass substrate, an organic film or an inorganic film.

11. The method for preparing electrode according to claim 1, wherein the "forming a buffer layer on the substrate" comprises:
by the chemical vapor deposition process, depositing the silica and/or silicon nitride and/or alumina on the substrate to form a buffer layer.

12. The method for preparing electrode according to claim 1, wherein the electrode comprises a first layer and a second layer arranged stacked, the first layer is bounded the substrate, the first layer comprises molybdenum and/or titanium and/or niobium, the second layer comprises copper element.

13. The method for preparing electrode according to claim 1, wherein the electrode is gate electrode, source electrode and drain electrode, pixel electrode and gate line or data lines.

* * * * *